United States Patent
Borenstain

[11] Patent Number: 6,104,046
[45] Date of Patent: Aug. 15, 2000

[54] DUAL-BAND INFRARED SENSING MATERIAL ARRAY AND FOCAL PLANE ARRAY

[75] Inventor: Shmuel I. Borenstain, Gush-Etzion, Israel

[73] Assignee: Sagi-Nahor Ltd., Jerusalem, Israel

[21] Appl. No.: 09/266,819

[22] Filed: Mar. 12, 1999

[51] Int. Cl.[7] .................. H01L 31/0328; H01L 31/0336; H01L 31/872; H01L 31/109; H01L 35/26

[52] U.S. Cl. .................. 257/185; 257/184; 257/440; 257/443; 257/458

[58] Field of Search ................................ 257/185, 184, 257/440, 443, 458

[56] References Cited

U.S. PATENT DOCUMENTS

| | | |
|---|---|---|
| 4,956,686 | 9/1990 | Borrello et al. |
| 5,518,934 | 5/1996 | Forrest et al. ................ 437/3 |
| 5,818,066 | 10/1998 | Duboz ........................ 257/21 |
| 5,969,375 | 10/1999 | Rosencher et al. .......... 257/21 |

Primary Examiner—Ngân V. Ngô
Attorney, Agent, or Firm—Mark M. Friedman

[57] ABSTRACT

A dual color focal plane array includes a sensing material array (SMA) backed by a readout multiplexer unit (RMU). The SMA includes two interleaved sets of pixels. Each pixel of the first set, sensitive only in a primary band, includes a QWIP backed by a grating. Each pixel of the second set, sensitive only in a secondary band, includes a QWIP in tandem with an intrinsic normal incidence detector but lacking a grating. The QWIPs with gratings detect in the primary band. The QWIPs without gratings are inactive. The intrinsic normal incidence detectors detect in the secondary band. The preferred intrinsic normal incidence detector is a PIN diode. The QWIPs and the intrinsic normal incidence detectors are deposited together epitaxially on a common substrate, and then the intrinsic normal incidence detectors are removed from the pixels of the first set by etching. Each pixel of the SMA is connected electrically to a cell of the RMU.

14 Claims, 3 Drawing Sheets

DUAL-BAND INFRARED SENSING MATERIAL ARRAY AND FOCAL PLANE ARRAY

FIELD AND BACKGROUND OF THE INVENTION

The present invention relates to infrared imaging and, more particularly, to a sensing material array for imaging infrared radiation in two different bands, and to a focal plane array based on this sensing material array.

Many applications require the ability to image a scene at infrared wavelengths in two different spectral bands, a capability that is commonly called "dual color thermal imaging". These applications include remote sensing for temperature determination and pollution monitoring.

Several types of dual color detectors are known. Borrello et al., in U.S. Pat. No. 4,956,686, teach a sensing material array of parallel columns of pixels based on two different HgCdTe alloys. Forrest et al., in U.S. Pat. No. 5,518,934, teach a sensing material array, based on a stack of three QWIPs (quantum well infrared photodetectors) that are sensitive to successively shorter wavelength bands. Each pixel of the array includes apertures that expose one of the three QWIPs to infrared radiation incident on that QWIP. Photodetectors that are based on two QWIPs in tandem, meaning that one QWIP is directly behind the other relative to the direction of propagation of incident radiation, so that incident radiation impinges on both QWIPs, have been reported by Yaohul Zhang et al., "A voltage-controlled tunable two-color infrared photodetector using GaAs/AlAs/GaAlAs and GaAs/GaAlAs stacked multiquantum wells", *Applied Physics Letters*, vol. 68 no. 15 (Apr. 8, 1996) pp. 2114–2116 and by M. Z. Tidrow et al., "A high strain two-stack two-color quantum well infrared photodetector", *Applied Physics Letters*, vol. 70 no. 7 (Feb. 17, 1997) pp. 859–861. The photodetector of Zhang et al. is tuned alternately to two different infrared wavelength bands, corresponding to the wavelength sensitivity of the two QWIPs, by adjusting the bias voltage applied to the stack. This "voltage tuning" is not entirely satisfactory, however, because each QWIP is sensitive to at least some extent to the other QWIP's band. In the photodetector of Tidrow et al., different pixels are sensitive to different bands, a long wavelength band and a medium wavelength band. All the pixels of the detector are fabricated as tandem stacks, each stack having a long wavelength QWIP above a medium wavelength QWIP; but then the long wavelength QWIPs are etched away from half of the stacks, and separate sets of electrical contacts are provided for the medium wavelength QWIPs thus uncovered and for the remaining long wavelength QWIPs, so that the uncovered medium wavelength QWIPs and the long wavelength QWIPs can be biased separately. Note that in this design, the medium wavelength QWIPs, in the stacks that include both kinds of QWIPs, are inactive. This design suffers from the added fabrication complexity associated with the provision of separate contacts for the active QWIPs and from the need for a non-standard readout-multiplexer unit.

There is thus a widely recognized need for, and it would be highly advantageous to have, a focal plane array, for dual color thermal imaging, with better band discrimination and simpler fabrication than focal plane arrays known heretofore.

SUMMARY OF THE INVENTION

According to the present invention there is provided a sensing material array for detecting infrared radiation in a first wavelength band and in a second wavelength band, including: (a) a first plurality of pixels, each pixel including a QWIP for detecting the infrared radiation of the first wavelength band; (b) a second plurality of pixels, each pixel including a detector for detecting the infrared radiation of the second wavelength band; and (c) a plurality of gratings, each grating in tandem only with a QWIP of one of the first plurality of pixels.

According to the present invention there is provided a focal plane array, for imaging infrared light in a first wavelength band and in a second wavelength band, including: (a) a sensing material array including: (i) a first plurality of pixels, each pixel including a QWIP for detecting the infrared radiation of the first wavelength band, (ii) a second plurality of pixels, each pixel including a detector for detecting the infrared radiation of the second wavelength band, and (iii) a plurality of gratings, each grating in tandem only with a QWIP of one of the first plurality of pixels; (b) a readout-multiplexer unit including a plurality of cells, each cell corresponding to one of the pixels of the sensing material array; and (c) for each cell, a mechanism for transferring electrical charge from the corresponding pixel to each cell.

The present invention is based on an aspect of the physics of QWIPs that is usually considered a drawback of these devices. A QWIP is a stack of many alternating plane layers of semiconductors of different composition, for example, alternating layers of GaAs and GaAlAs. These layers interact only with the electric field component of incident infrared radiation that is perpendicular to the layers. This means that these layers do not interact with normally incident radiation, whose electric field vector is parallel to the layers. One way of coaxing a QWIP to interact with normally incident radiation is to fabricate a grid on the back side (the side facing away from the incident radiation) of the QWIP. Normally incident light scatters off the grid, and scattered light that propagates in the QWIP at angles other than normal then interacts with the QWIP. For a review of the relevant physics of QWIPs, see B. F. Levine, "Quantum-well infrared photodetectors", *Journal of Applied Physics*, vol. 74 no. 8 (Oct. 15, 1993) pp. R1–R81, with particular reference to pp. R65–R68.

In order to detect infrared radiation in two different wavelength bands with better wavelength discrimination than has been achieved heretofore, the sensing material array of the present invention includes two sets of pixels. Each pixel of either set include a QWIP that is sensitive to one of the two wavelength bands, referred to herein as the primary band. In the pixels of one set, the QWIPs are backed by gratings, so that those pixels are sensitive to the primary band. In the pixels of the other set, the QWIPs are in tandem with non-QWIP infrared detectors of the other wavelength band, referred to herein as the secondary band. These pixels lack gratings, so that their QWIPs interact minimally with incident radiation, and do not interact at all with normally incident radiation, while the non-QWIP detectors interact with radiation of the secondary band. Thus, the first set of pixels acquires an image exclusively in the primary band, while the second set of pixels simultaneously acquires an image almost exclusively in the secondary band.

The non-QWIP detectors are referred to herein as "intrinsic normal incidence detectors" because, unlike QWIPs, they intrinsically absorb and respond to incident electromagnetic radiation regardless of the direction of the electric field vector of that radiation. In particular, non-QWIP detectors absorb and respond to normally incident electromagnetic radiation.

Preferably, both sets of pixels are grown together epitaxially on a common substrate by first depositing the QWIPs on the entire substrate, then depositing the non-QWIP detectors on top of all the QWIPs, then removing the non-QWIP detectors from half the area of the sensing material array and fabricating gratings above the QWIPs from which the non-QWIP detectors have been removed. Most preferably, the non-QWIP detectors are removed by etching the device in a chessboard pattern, leaving behind two interleaved arrays of pixels, the first array including both QWIPs and non-QWIP detectors, but no gratings, and consequently being sensitive only to the secondary band. After the QWIPs of the second array have been provided with gratings, the pixels of the second array are sensitive only to the primary band.

Preferably, the common substrate is InP, the QWIPs are composed of alternating layers of InGaAsP and InAlAs, InGaAs and InAlAs, or InGaAs and InP, and the non-QWIP detectors are PIN diodes made of three layers of appropriately doped InGaAsP, InGaAs or InP.

A focal plane array of the present invention consists of a sensing material array of the present invention coupled to a readout-multiplexer unit. Each cell of the readout-multiplexer unit is coupled electrically to a pixel of the sensing material array so that electrical charge that accumulates in a pixel as a result of that pixel's interaction with incident radiation can be transferred to the corresponding cell of the readout-multiplexer unit. Preferably, this coupling is effected by indium bump contacts.

BRIEF DESCRIPTION OF THE DRAWINGS

The invention is herein described, by way of example only, with reference to the accompanying drawings, wherein.

DESCRIPTION OF THE PREFERRED EMBODIMENTS

The present invention is of a sensing material array which can be used for dual color thermal imaging with better band discrimination than in the case of presently known sensing material arrays, and of a focal plane array based thereon.

The principles and operation of dual color thermal imaging according to the present invention may be better understood with reference to the drawings and the accompanying description.

Figure 1:
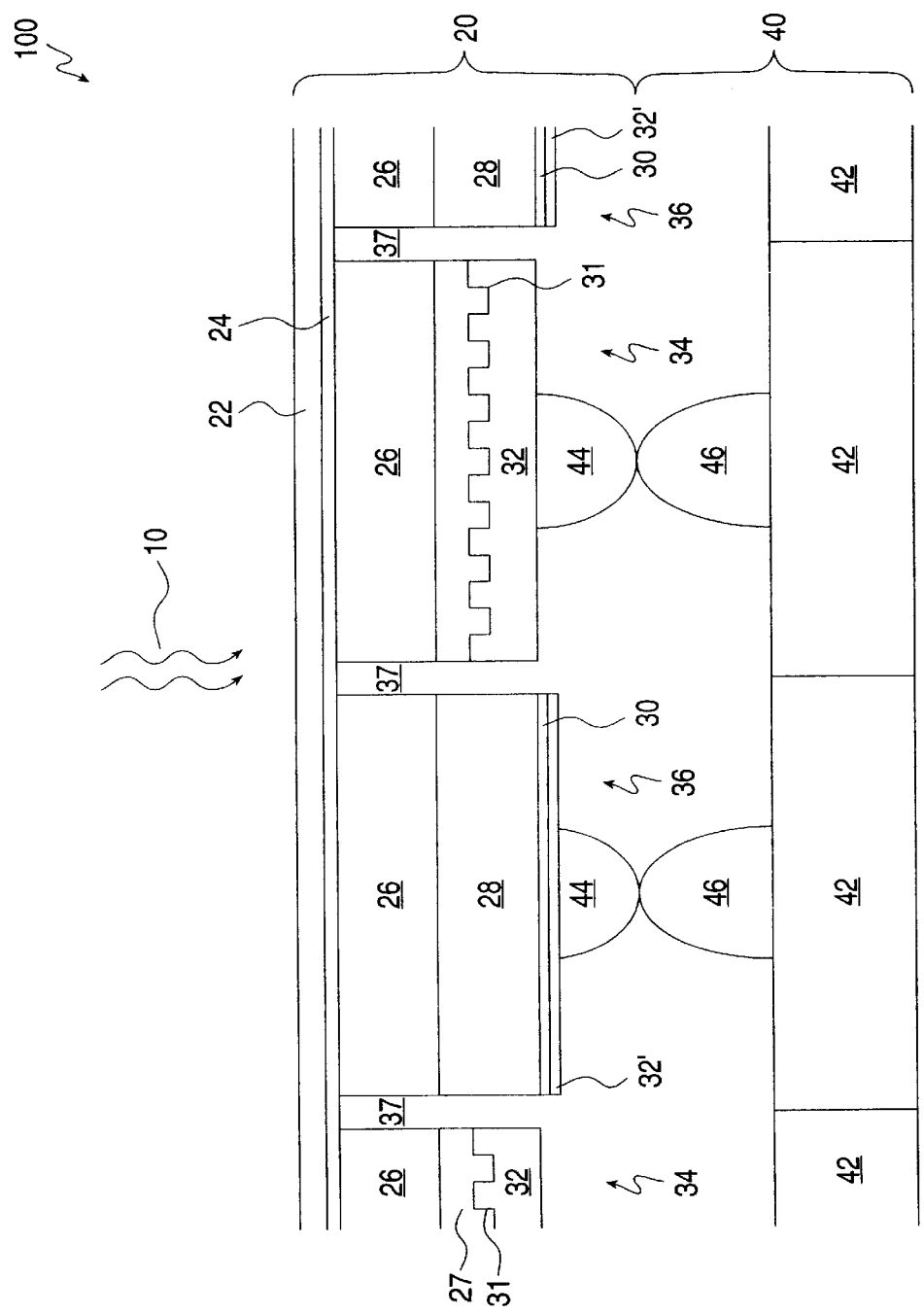
FIG. 1 is a schematic transverse cross section of a focal plane array of the present invention.

Referring now to the drawings, FIG. 1 is a schematic transverse cross-section of a focal plane array (FPA) 100 of the present invention. FPA 100 includes a sensing material array (SMA) 20 that faces and receives incident infrared radiation 10 and converts radiation 10 to electrical charges, and a readout-multiplexer unit (RMU) 40 that receives these electrical charges for further processing.

SMA 20 is based on a substrate 22 of semi-insulating InP on which is deposited an n-doped InP layer 24. On layer 24 are deposited two sets of pixels, a primary set 34 for detecting radiation 10 in the primary band and a secondary set 36 for detecting radiation 10 in the secondary band. Each pixel 34 or 36 includes a QWIP 26 deposited on layer 24. In each primary pixel 34, a layer 27 of n-doped InGaAsP is deposited on QWIP 26 and a grating 31 is etched in the surface of layer 27 that faces away from QWIP 26. A contact layer 32 of a metal that makes good electrical contact with layer 27, for example, AuGe/Au, is deposited on grating 31. In each secondary pixel 36, a PIN diode 28 is deposited on QWIP 26, a layer 30 of p-doped InP is deposited on PIN diode 28, and a contact layer 32' of a metal that makes good electrical contact with layer 30, for example, AuZn/Au, is deposited on layer 30'. Note that gratings 31 appear only in primary pixels 34 and not in secondary pixels 36. Note also that the relative thicknesses of layers 22, 24, 26, 27, 28, 30, 32 and 32' are not to scale.

RMU 40 includes multiple cells 42, each cell 42 corresponding to, and receiving electrical charge from, one pixel 34 or 36. Each cell 42 includes a signal integration unit and an amplifier, as well as electronic gates that cooperate with other electronic gates outside cells 42 to multiplex the signals from cell 42 as an ordered train of video pulses that represents the detected image. An example of a suitable RMU is the model ISC9705, available from Indigo Systems, Inc. of Santa Barbara Calif. Pixels 34 and 36 are connected electrically to corresponding cells 42 via indium bump interconnects 44 and 46.

Figure 2:
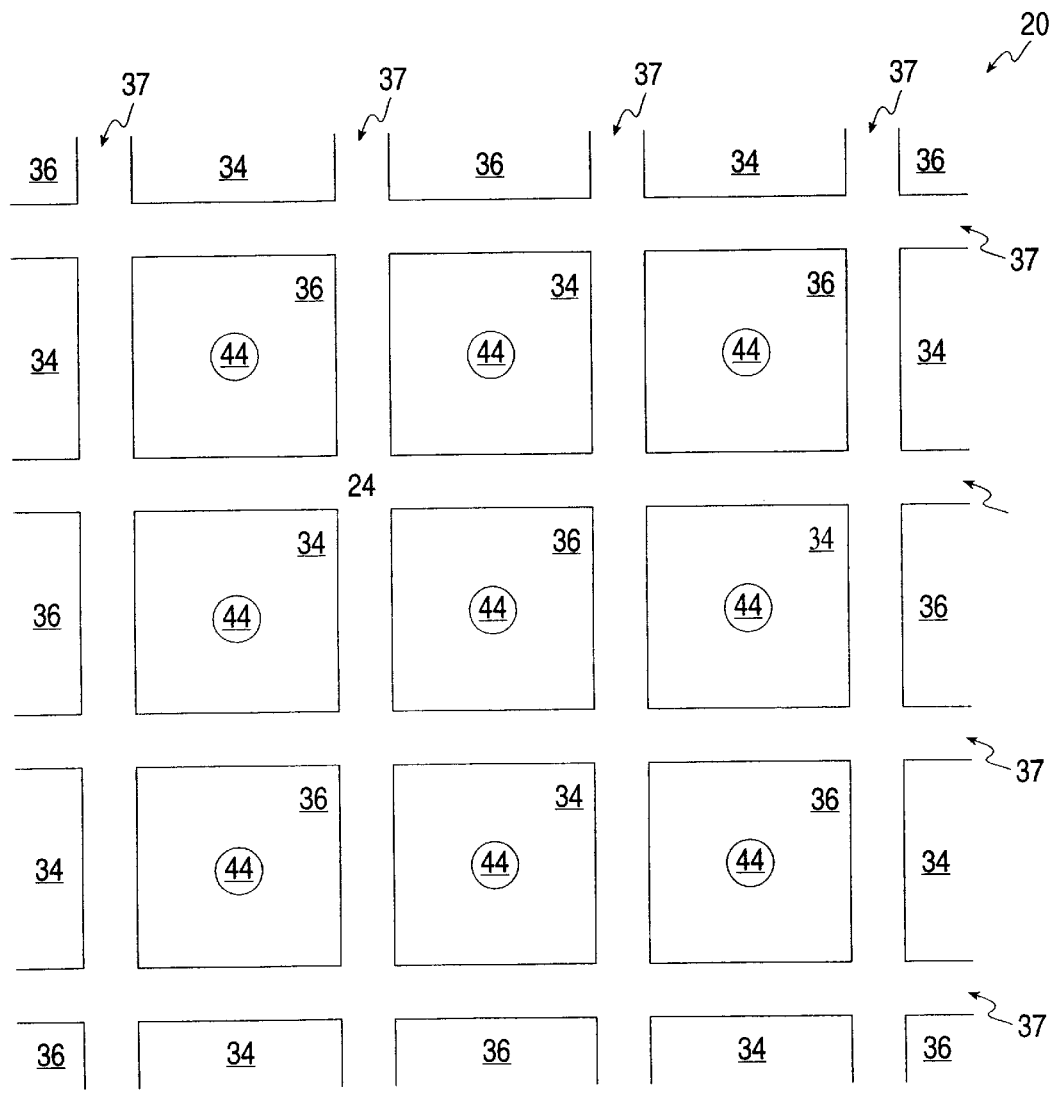
FIG. 2 is a plan view of the reverse side of the sensing material array of FIG. 1.

FIG. 2 is a plan view of the reverse side of SMA 20, i.e., the side of SMA 20 that faces away from incident radiation 10. Pixels 34 and 36 are interleaved in a chessboard pattern, and separated by channels 37. Typically, SMA 20 has more than 100,000 pixels 34 and 36, each smaller than 30 microns by 30 microns.

SMA 20 is grown by molecular beam epitaxy, metal-organic chemical vapor deposition (MOCVD) or a similar process and shaped by conventional photolithography.

The first step in the fabrication of SMA 20 is the deposition of the following layers:

A. semi-insulating InP substrate
B. n-doped InP layer, 1500Å thick
C. undoped $In_{0.52}Al_{0.48}As$ or undoped InP, 500Å thick
D. n-doped $In_{(u)}Ga_{(1-u)}As_{(w)}P_{((1-w))}$ 30Å to 50Å thick (Layers C and D are repeated 50 times.)
E. undoped $In_{0.52}Al_{0.48}As$ or undoped InP, 500Å thick
F. n-doped $In_{(x)}Ga_{(1-x)}As_{(y)}P_{(1-y)}$, 2000Å thick
G. undoped $In_{(x)}Ga_{(1-x)}As_{(y)}P_{(1-y)}$, 20,000Å thick
H. p-doped $In_{(x)}Ga_{(1-x)}As_{(y)}P_{(1-y)}$, 2000Å thick
I. p-doped InP, 5000Å thick Preferably, layer B is doped with Si at a concentration of $2 \times 10^{18}$ cm$^{-3}$, layers D are doped with Si at a concentration of from $2 \times 10^{17}$ cm$^{-3}$ to $1 \times 10^{18}$ cm$^{-3}$, layer F is doped with Si at a concentration of $2 \times 10^{18}$ cm$^{-3}$, and layers H and I are doped with Be at a concentration of $2 \times 10^{18}$ cm$^{-3}$. All the layers are pseudomorphic and lattice matched, and hence strain-free. Examples of preferred values of subscripts u, w, x and y are given below.

Figure 3:
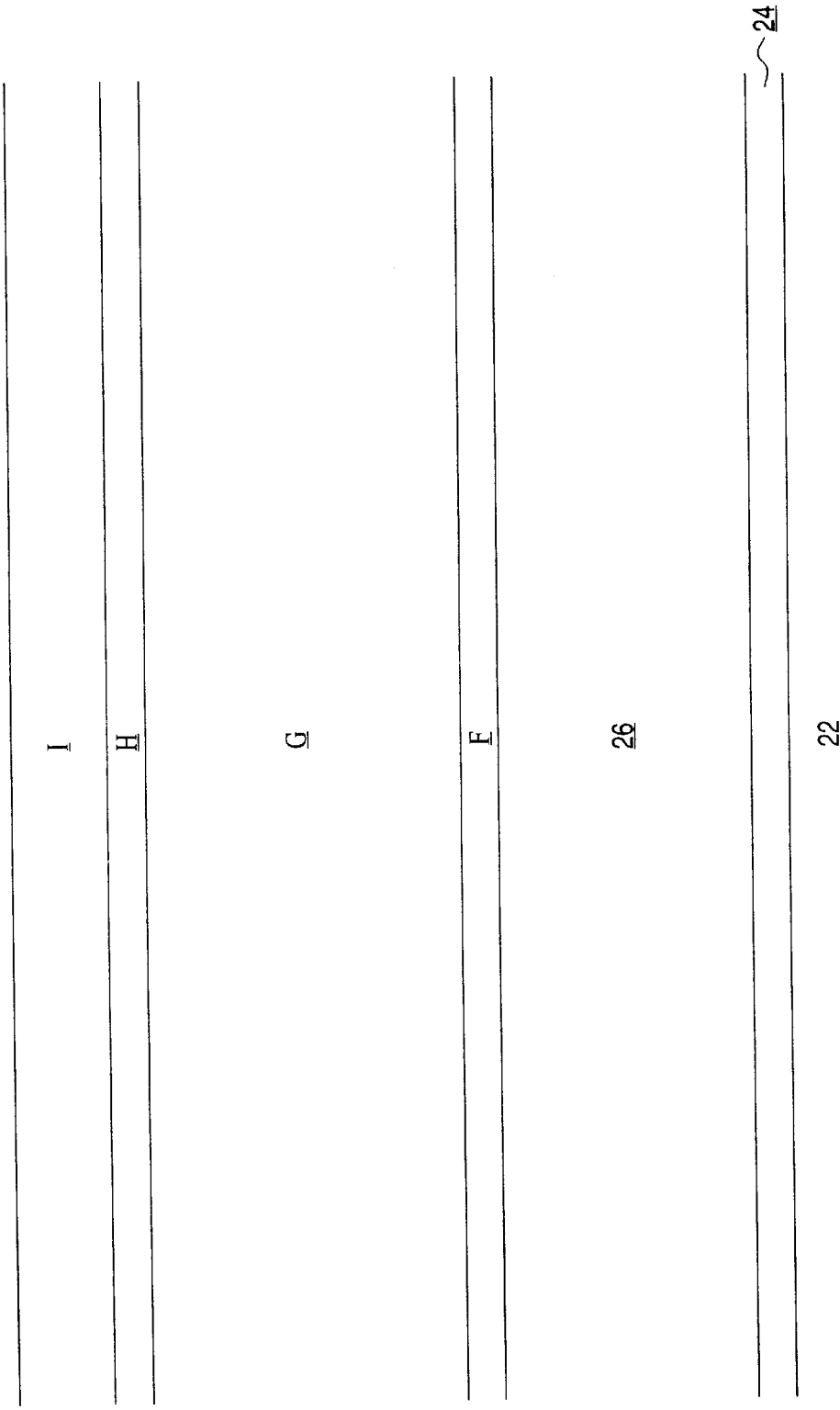
FIG. 3 is a transverse cross section of nine semiconductor layers at an intermediate stage in the fabrication of the sensing material array of FIG. 1.

FIG. 3 is a transverse cross section of layers A–I as deposited. Layer A is designated by reference numeral 22 because layer A is substrate 22 in the final SMA 20. Layer B is designated by reference numeral 24 because layer B is n-doped InP layer 24 in the final SMA 20. The multiple copies of layers C and D, as well as layer E, are designated by reference numeral 26 because layers C, D and E become QWIPs 26 in the final SMA 20. Layer F becomes layer 27 in pixels 34 of the final SMA 20. Layers F, G and H become PIN diodes 28 in pixels 36 of the final SMA 20.

In the second step in the fabrication of SMA 20, layers G, H and I are removed from pixels 34 and gratings 31 are etched in layer F of pixels 34. This is done by conventional photolithography. In the third step in the fabrication of SMA 20, channels 37 are etched through layers C–I, also by conventional photolithography, to define pixels 34 and 36. In the fourth step in the fabrication of SMA 20, AuGe/Au contact layers 32 are deposited above pixels 34 and AuZn/Au contact layers 32' are deposited above pixels 36. In the final step in the fabrication of SMA 20, indium bump interconnects are emplaced above pixels 34 and 36.

By varying the thickness and compositions of layers C, D and E, QWIPs 26 can be tuned to any desired wavelength in the mid infrared or the long infrared. QWIPs 26 typically have a bandwidth of 0.5 to 1.0 microns FWHM in the mid infrared and 1 to 2 microns in the long infrared. Using $In_{0.52}Al_{0.48}As$ in layers C and E and using u=0.52, w=1, a thickness of 30Å and a Si concentration of $2\times10^{17}$ cm$^{-3}$ in layers D produces QWIPs 26 with a peak photoresponse at 4.2 microns (G. Hasnain et al., "Mid infrared in the 3–5 $\mu$m band using bound to continuum state absorption in InGaAs/InAlAs MQW", *Applied Physics Letters* vol. 56 (1990) p. 770; H. Lobetanzer et al., "Intersubband absorption in a modulation doped GaInAs/AlInAs", *Applied Physics Letters* vol. 58 (1988) p. 2024). The wavelength of peak response is increased by making w<1 to add phosphorous to layers D and by increasing the thickness of layers D beyond 30Å. For sensitivity to long wavelength infrared, InP is used instead of $In_{0.52}Al_{0.48}As$ in layers C and E. Using InP in layers C and E and using u=0.52, w=1, a thickness of 50Å and a Si concentration of $1\times10^{18}$ cm$^{-3}$ in layers D produces QWIPs 26 with a peak photoresponse at 7.8 microns (S. D. Gunapala et al., "InGaAs/InP long wavelength quantum well infrared photodetectors", *Applied Physics Letters* vol. 58 (1991) p. 2024). For other QWIP structures that are compatible with the present invention, see the review article by B. F. Levine cited above.

The longest wavelength detectable by PIN diode 28 is 1.6 microns (at an operating temperature of 77° K.), when x=0.53 and y=1. Such detectors, which are used extensively in the communication industry, have quantum efficiencies in excess of 50%. With a composition of x=1 and y=0, a cutoff wavelength of 0.87 microns is obtained. For more information about the x=0.53, y=1 diode, see D. Wood, *Optoelectronics Semiconductor Devices* (Prentice Hall, 1994) p. 276 and J. Singh, *Semiconductor Optoelectronics, Physics and Technology* (McGraw-Hill, 1995), pp. 347–475, especially p. 373. For more information about the relationship between subscripts x and y, see T. Pearsall (ed.), *GaInAsP Alloy Semiconductors* (J. Wiley and Sons, 1982).

To use FPA 100, RMU 40 establishes a bias of between 0 and 10 volts between layer 24, acting as an anode, and indium bumps 44 and 46, acting as cathodes. Note that because the p-doped sides of PIN diodes 28 are in electrical contact with indium bump interconnects 44, PIN diodes 28 are under reverse bias. Incident radiation 10 creates electron-hole pairs in PIN diodes 28 of pixels 36 and in QWIPs 26 of pixels 34. The electrons migrate to anode 24 and the holes migrate to cathodes 26. This migration constitutes an electrical current that is sensed by RMU 40.

The above description is of a SMA 20 based on the InP system. The scope of the present invention includes similar SMAs based on other systems, such as, for example, the GaAs system, the GaAs/GaAlAs/InGaAs system and the Si/SiGe system. Using the GaAs system, the primary band may be set anywhere between 5 microns and 20 microns, with a bandwidth of from 1 to 3 microns FWHM. The secondary band of an SMA of the present invention based on the GaAs system typically operates at 1.1 microns.

While the invention has been described with respect to a limited number of embodiments, it will be appreciated that many variations, modifications and other applications of the invention may be made.

What is claimed is:

1. A sensing material array for detecting infrared radiation in a first wavelength band and in a second wavelength band, comprising:

(a) a first plurality of pixels, each said pixel including a QWIP for detecting the infrared radiation of the first wavelength band;

(b) a second plurality of pixels, each said pixel including a detector for detecting the infrared radiation of the second wavelength band; and (c) a plurality of gratings, each said grating in tandem only with a QWIP of one of said first plurality of pixels.

2. The sensing material array of claim 1, wherein said QWIPs and said detectors are deposited epitaxially on a common substrate.

3. The sensing material array of claim 1, wherein each pixel of said second plurality includes one of said QWIPs, in tandem with said detector.

4. The sensing material array of claim 1, wherein each said QWIP includes a plurality of layers of InGaAsP alternating with a like plurality of layers of InAlAs.

5. The sensing material array of claim 1, wherein each said QWIP includes a plurality of layers of InGaAs alternating with a like plurality of layers of InAlAs.

6. The sensing material array of claim 1, wherein each said QWIP includes a plurality of layers of InGaAs alternating with a like plurality of layers of InP.

7. The sensing material array of claim 1, wherein said detectors are intrinsic normal incidence detectors.

8. The sensing material array of claim 7, wherein said detectors are PIN diodes.

9. The sensing material array of claim 8, wherein each said PIN diode includes three layers of InGaAsP, a first said layer being n-doped, a third said layer being p-doped, and said second layer being between said first layer and said third layer.

10. The sensing material array of claim 8, wherein each said PIN diode includes three layers of InGaAs, a first said layer being n-doped, a third said layer being p-doped, and said second layer being between said first layer and said third layer.

11. The sensing material array of claim 8, wherein each said PIN diode includes three layers of InP, a first said layer being n-doped, a third said layer being p-doped, and said second layer being between said first layer and said third layer.

12. The sensing material array of claim 1, including substantially equal numbers of said pixels of said first plurality and said pixels of said second plurality, and wherein said pixels of said first plurality and said pixels of said second plurality are interleaved in a common plane.

13. A focal plane array, for imaging infrared light in a first wavelength band and in a second wavelength band, comprising:

(a) a sensing material array including:

(i) a first plurality of pixels, each said pixel including a QWIP for detecting the infrared radiation of the first wavelength band, (ii) a second plurality of pixels, each said pixel including a detector for detecting the infrared radiation of the second wavelength band, and (iii) a plurality of gratings, each said grating in tandem only with a QWIP of one of said first plurality of pixels;

(b) a readout-multiplexer unit including a plurality of cells, each said cell corresponding to one of said pixels of said sensing material array; and (c) for each said cell, a mechanism for transferring electrical charge from said corresponding pixel to said each cell.

14. The focal plane array of claim 13, wherein said mechanism includes an indium bump interconnect.

* * * * *